United States Patent
Chang et al.

(10) Patent No.: US 8,334,187 B2
(45) Date of Patent: Dec. 18, 2012

(54) HARD MASK FOR THIN FILM RESISTOR MANUFACTURE

(75) Inventors: Li-Wen Chang, Sanxia Township, Taipei County (TW); Der-Chyang Yeh, Hsin-Chu (TW); Chung-Yi Yu, Hsin-Chu (TW); Hsun-Chung Kuang, Yang-Mei (TW); Hua-Chou Tseng, Hsin-Chu (TW); Chih-Ping Chao, Hsinchu (TW); Ming Chyi Liu, Hsinchu (TW); Yuan-Tai Tseng, Lugu Township, Nantou County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 12/824,495

(22) Filed: Jun. 28, 2010

(65) Prior Publication Data

US 2011/0318898 A1 Dec. 29, 2011

(51) Int. Cl.
*H01L 21/20* (2006.01)

(52) U.S. Cl. .......... 438/384; 338/25; 438/383; 438/381; 438/382; 438/385; 257/359; 257/383; 257/536; 216/16; 216/18; 216/38; 216/39

(58) Field of Classification Search .................... None
See application file for complete search history.

(56) References Cited

U.S. PATENT DOCUMENTS

| | | | |
|---|---|---|---|
| 5,468,672 A | 11/1995 | Rosvold | |
| 5,547,896 A * | 8/1996 | Linn et al. | 438/384 |
| 6,287,933 B1 | 9/2001 | Iida et al. | |
| 6,326,256 B1 | 12/2001 | Bailey et al. | |
| 6,737,326 B2 * | 5/2004 | Steinmann et al. | 438/381 |
| 6,855,585 B1 | 2/2005 | Kalnitsky et al. | |
| 7,341,958 B2 | 3/2008 | Gasner et al. | |
| 7,410,879 B1 * | 8/2008 | Hill et al. | 438/384 |
| 7,669,313 B2 | 3/2010 | Fivas et al. | |
| 2006/0040458 A1 * | 2/2006 | Phan et al. | 438/382 |
| 2007/0048960 A1 | 3/2007 | Jaiswal et al. | |
| 2009/0023263 A1 * | 1/2009 | Phan et al. | 438/384 |

OTHER PUBLICATIONS

Valery V. Felmetsger, "Microstructure and Temperature Coefficient of Resistance of Thin Cermet Resistor Films Deposited from CrSi2-Cr-SiC Targets by S-Gun Magnetron", J. Vac. Sci. Technol. A 28(1), Jan./Feb. 2010, 0734-2101/2010/28(1)/33/8/$30.00, 2010 American Vacuum Society, pp. 33-40.

Murzy Jhabvala et al., "Development of Low-Noise High Value Chromium Silicide Resistors for Cryogenic Detector Applications", 15 pages.

* cited by examiner

*Primary Examiner* — Julio J Maldonado
*Assistant Examiner* — Shantanu C Pathak
(74) *Attorney, Agent, or Firm* — Haynes and Boone, LLP

(57) ABSTRACT

Methods of fabricating an integrated circuit device, such as a thin film resistor, are disclosed. An exemplary method includes providing a semiconductor substrate; forming a resistive layer over the semiconductor substrate; forming a hard mask layer over the resistive layer, wherein the hard mask layer includes a barrier layer over the resistive layer and a dielectric layer over the barrier layer; and forming an opening in the hard mask layer that exposes a portion of the resistive layer.

20 Claims, 5 Drawing Sheets

HARD MASK FOR THIN FILM RESISTOR MANUFACTURE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices are scaled down through various technology nodes, thin film resistor materials, such as SiCr, NiCr, and TaN, have been employed because these materials exhibit stability and desired resistivity properties. For example, thin film resistor materials can provide low thermal coefficients of resistance and low voltage coefficients of resistance. Fabricating a thin film resistor includes forming a thin film resistor material layer over a substrate with portions of a hard mask layer, used during the fabricating, remaining over ends of the resistor material layer. The hard mask layer may be used for electrical connection purposes, and typically is a TiN, TiW, or Mo layer. Although existing hard mask layers for thin film resistor manufacturing have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-5A are diagrammatic top views of an integrated circuit device at various fabrication stages of fabrication according to the method of FIG. 1.

FIGS. 2B-5B are diagrammatic cross-sectional views of the integrated circuit device illustrated in FIGS. 2A-5A, respectively.

DETAILED DESCRIPTION

Figure 1:
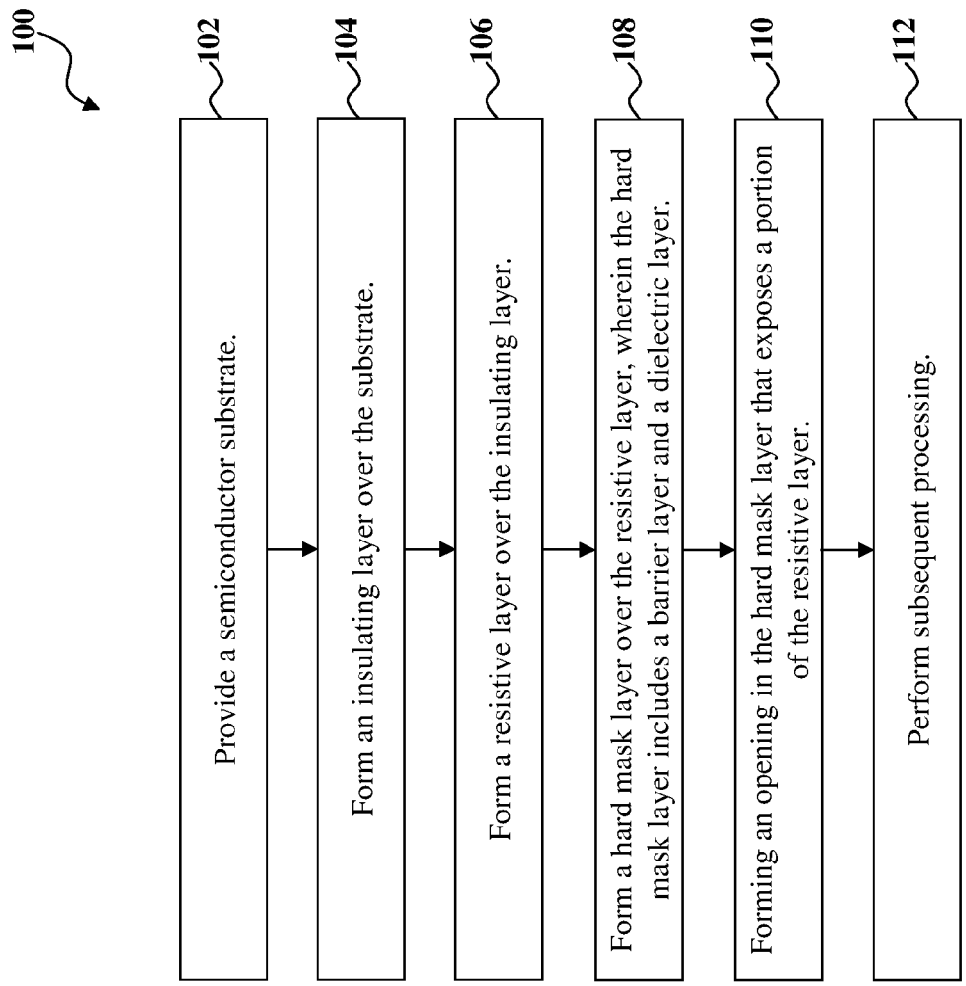
FIG. 1 is a flow chart of a method for fabricating an integrated circuit device that includes a thin film resistor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of an embodiment of a method 100 for fabricating an integrated circuit device according to various aspects of the present disclosure. The method 100 begins at block 102 where a semiconductor substrate is provided. At block 104, an insulating layer is formed over the substrate. At block 106, a resistive layer is formed over the insulating layer. The method continues with block 108 where a hard mask layer is formed over the resistive layer. The hard mask layer includes a barrier layer and a dielectric layer. In the present embodiment, the barrier layer is formed over the resistive layer, and the dielectric layer is formed over the barrier layer. At block 110, an opening is formed in the hard mask layer. The opening exposes a portion of the resistive layer. The method 100 continues with block 112 where subsequent processing is performed to complete fabrication of the integrated circuit device. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

FIGS. 2A-5A are diagrammatic top views of an integrated circuit device 200, in portion or entirety, at various stages of fabrication according to the method 100 of FIG. 1. FIGS. 2B-5B are diagrammatic cross-sectional views of the integrated circuit device 200 illustrated in FIGS. 2A-5A, respectively. In the depicted embodiment, the integrated circuit device 200 includes a thin film resistor. The integrated circuit device 200 may further include memory cells and/or logic circuits; passive components such as resistors, capacitors, inductors, and/or fuses; and active components, such as n-channel field effect transistors (NFETs), p-channel field effect transistors (PFETs), metal-oxide-semiconductor field effect transistors (MOSFETs), complementary metal-oxide-semiconductor transistors (CMOSs), high voltage transistors, and/or high frequency transistors; other suitable components; or combinations thereof. FIGS. 2A-5A and FIGS. 2B-5B have been simplified for the sake of clarity to better understand the inventive concepts of the present disclosure. Additional features can be added in the integrated circuit device 200, and some of the features described below can be replaced or eliminated in other embodiments of the integrated circuit device 200.

Figure 2A:
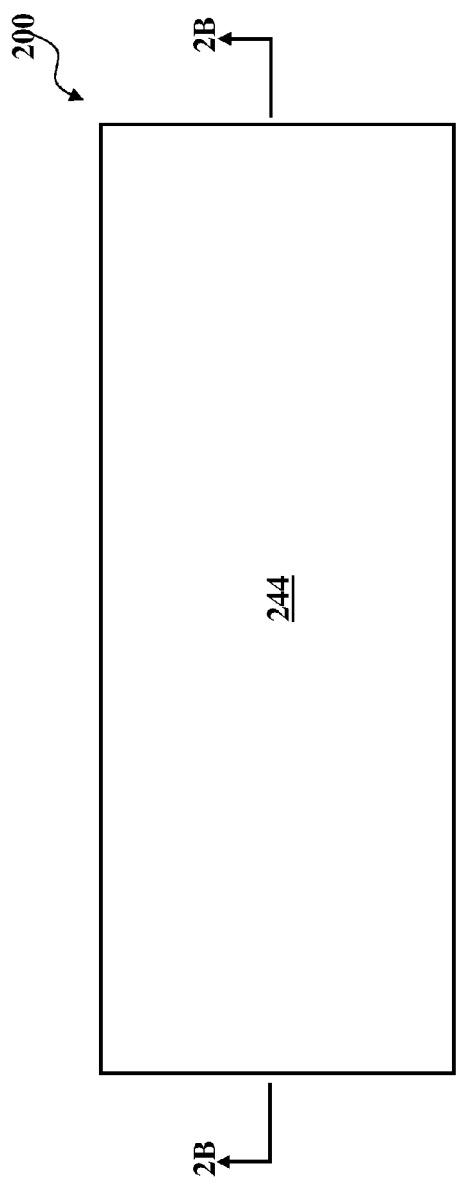
Figure 2B:
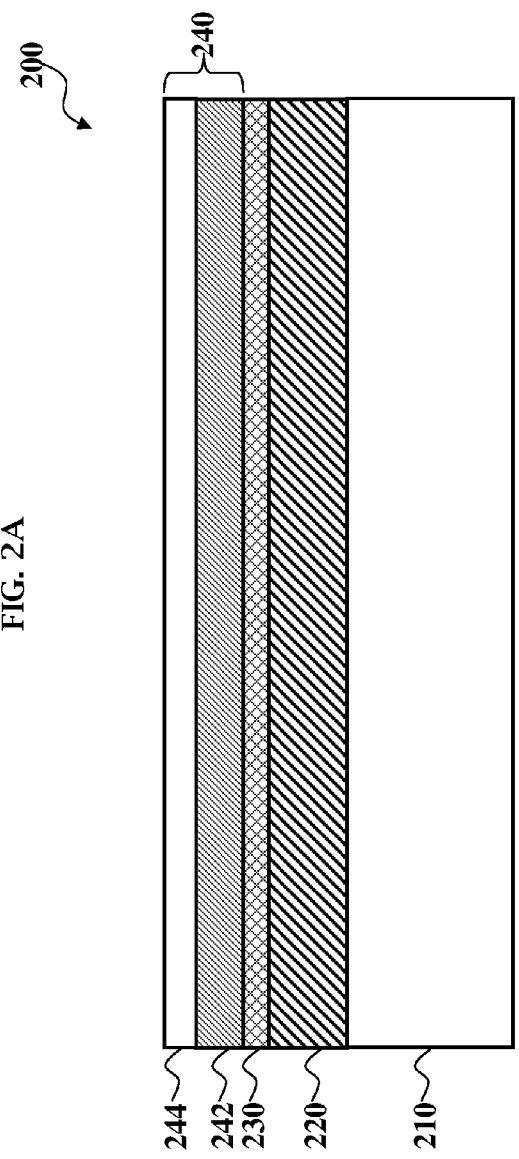

Referring to FIGS. 2A and 2B, the integrated circuit device 200 includes a substrate 210. In the depicted embodiment, the substrate 210 is a semiconductor substrate including silicon. The substrate 210 may be a p-type or n-type substrate. Alternatively, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 210 may be a semiconductor on insulator (SOI). The semiconductor substrate 210 may include a doped epi layer, a gradient semiconductor layer, and/or a semiconductor layer overlying another semiconductor layer of a different type, such as a silicon layer on a silicon germanium layer.

The substrate 210 includes various doped regions (not illustrated) depending on design requirements, such as p-type wells or n-type wells. The doped regions are doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure. Isolation features (not illustrated) are formed in the substrate 210 to isolate various regions of the substrate 210, and various devices of the integrated circuit device 200. The isolation features utilize isolation technology, such as local oxidation of silicon (LOCOS) and/or shallow trench isolation (STI), to define and electrically isolate the various regions.

An insulating layer 220 is formed over the substrate 210. In the depicted embodiment, the insulating layer 220 is an oxide layer, such as a silicon oxide layer. The insulating layer 220 has a thickness of about 2,000 Å to about 20,000 Å. The insulating layer 220 could alternatively or additionally include other suitable materials, such as intermetal oxide (IMO) group materials including plasma enhanced CVD oxide (PE-oxide), fluorosilicate glass (FSG), undoped silicate glass (USG), tetraethylorthosilicate (TEOS) formed oxide, high-aspect-ratio-process (HARP) formed oxide, or combinations thereof. The insulating layer 220 is formed by a suitable process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), pulse laser deposition (PLD), other suitable techniques, or combinations thereof.

A resistive layer 230 is formed over the insulating layer 220. In the depicted embodiment, the resistive layer 230 includes a thin film resistor material, such as silicon chromium (SiCr). Alternatively, the resistive layer 230 includes other suitable resistive materials, such as NiCr or TaN. The material of the resistive layer 230 can be selected based on the resistor properties desired. The resistive layer 230 has a thickness of about 100 Å to about 1,000 Å. The resistive layer 230 is formed by a suitable process, such as CVD, PVD, ALD, HDPCVD, MOCVD, RPCVD, PECVD, PLD, other suitable techniques, or combinations thereof.

A hard mask layer 240 is formed over the resistive layer 230. In the depicted embodiment, the hard mask layer 240 includes a barrier layer 242 and a dielectric layer 244. The barrier layer 242 is formed over the resistive layer 230, and the dielectric layer 244 is formed over the barrier layer 242. In the depicted embodiment, the barrier layer 242 is a conductive layer. For example, the barrier layer 242 includes TiN. Alternatively, the barrier layer 242 includes TiW, Mo, other suitable conductive material, or combinations thereof. The barrier layer 242 has a thickness of about 250 Å to about 2,000 Å. The barrier layer 242 is formed by a suitable process, such as those described above. The barrier layer 242 and the resistive layer 230 may be formed in-situ in a same processing chamber.

In the depicted embodiment, the dielectric layer 244 includes silicon oxynitride (SiON). The SiON layer has a thickness of about 100 Å to about 1,000 Å. Alternatively, the dielectric layer 244 includes silicon oxide, silicon nitride, amorphous carbon, other suitable dielectric material, or combinations thereof. The dielectric layer 244 may have a multilayer structure. For example, in another embodiment, the dielectric layer 244 includes an oxide layer formed over the barrier layer 242, and a SiON or SiN layer formed over the oxide layer. In another embodiment, the dielectric layer 244 includes an amorphous carbon film layer formed over the barrier layer 242, and a SiON or SiN layer formed over the amorphous carbon film layer. In yet another embodiment, the amorphous carbon film layer and the SiON or SiN layer are reversed. The dielectric layer 244 may include other combinations of the various dielectric materials. The dielectric layer 244 could be a polysilicon layer, or a multi-layer that includes a polysilicon layer and dielectric material layer. The dielectric layer 244 is formed by a suitable process, such as those described above.

Figure 3A:
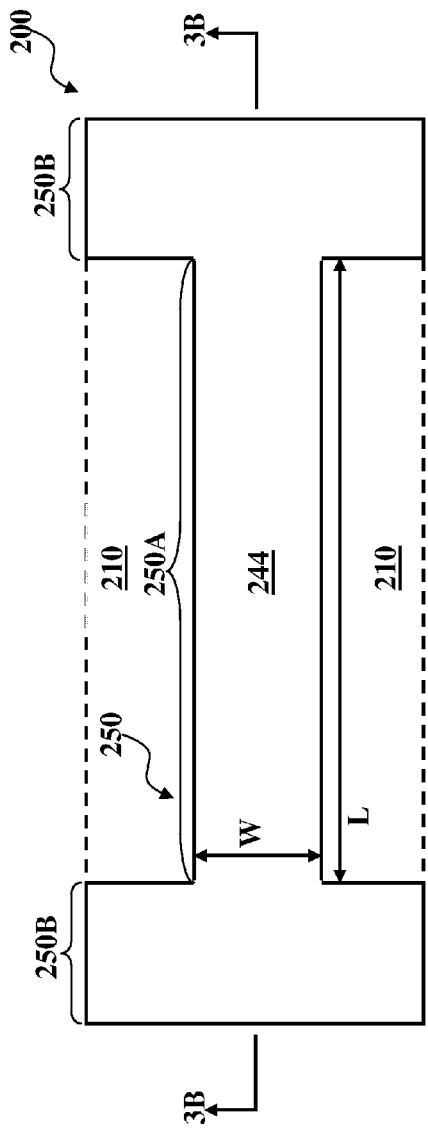
Figure 3B:
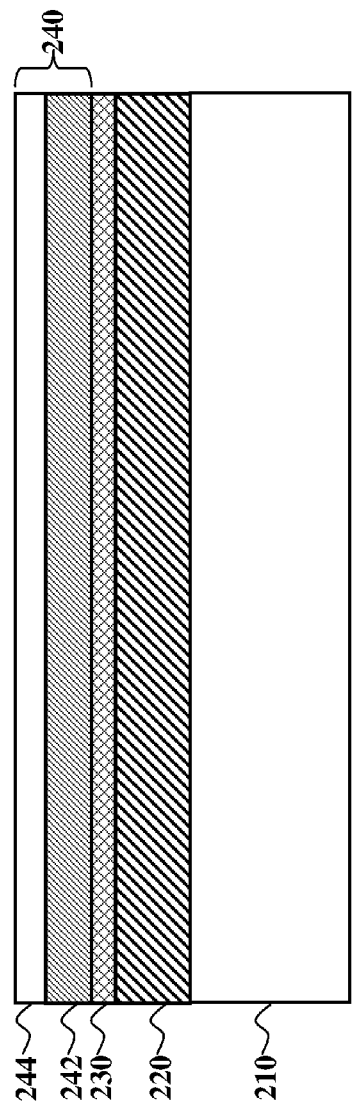

Referring to FIGS. 3A and 3B, portions of the hard mask layer 240, resistive layer 230, and insulator layer 220 are removed to form a thin film resistor structure 250. The thin film resistor structure 250 includes portion 250A and portions 250B. The portion 250A defines a shape of a thin film resistor, specifically a length L and a width W of the thin film resistor. The portions 250B define landing pad areas. In the depicted embodiment, the thin film resistor structure 250 is formed by a lithography and etching process. For example, a resist layer (not illustrated) is formed over the hard mask layer 240 and patterned by a lithography process to have one or more openings that define a pattern for the thin film resist structure 250. The one or more openings expose portions of the hard mask layer 240, specifically the dielectric layer 244. An exemplary lithography process may include processing steps of resist coating, soft baking, mask aligning, exposing, post-exposure baking, developing the resist, and/or hard baking. The exemplary lithography process uses a mask to define the resistor shape and landing pad areas. The lithography process may be implemented or replaced by other proper techniques, such as maskless lithography, electron-beam writing, ion-beam writing, and/or molecular imprint. The lithography process may implement nanoimprint lithography techniques. An etching process, using the patterned resist layer as a mask, removes the exposed portions of the hard mask layer 240 along with the resistive layer 230 and insulator layer 220 underlying the exposed portions of the hard mask layer 240 to form the thin film resist structure 250. In the depicted embodiment, the etching process is a dry etching process. Alternatively, a wet etching process or combination dry and wet etching process could be utilized. Thereafter, the patterned resist layer is removed, for example, by a resist stripping process, such as an $O_2$ plasma ashing process.

Figure 4A:
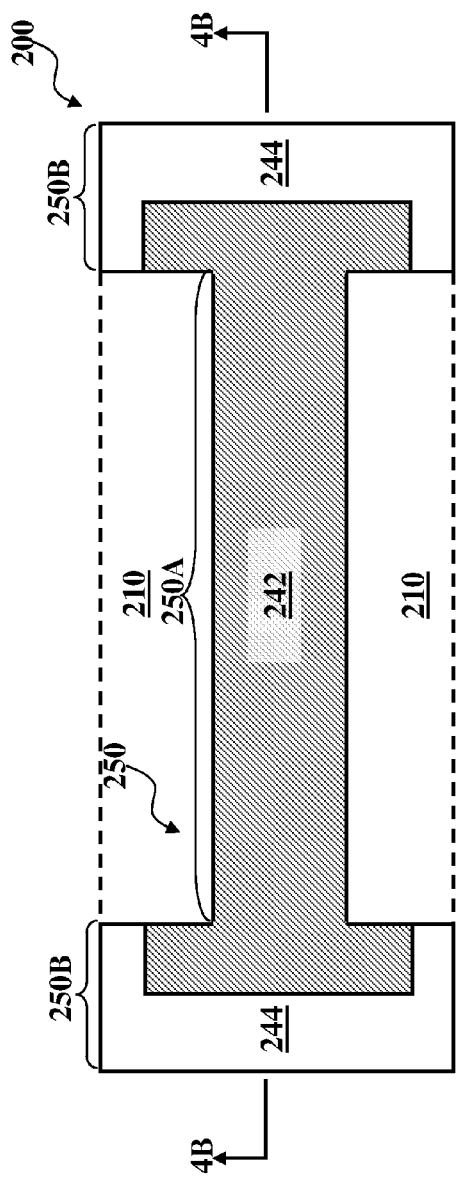
Figure 4B:
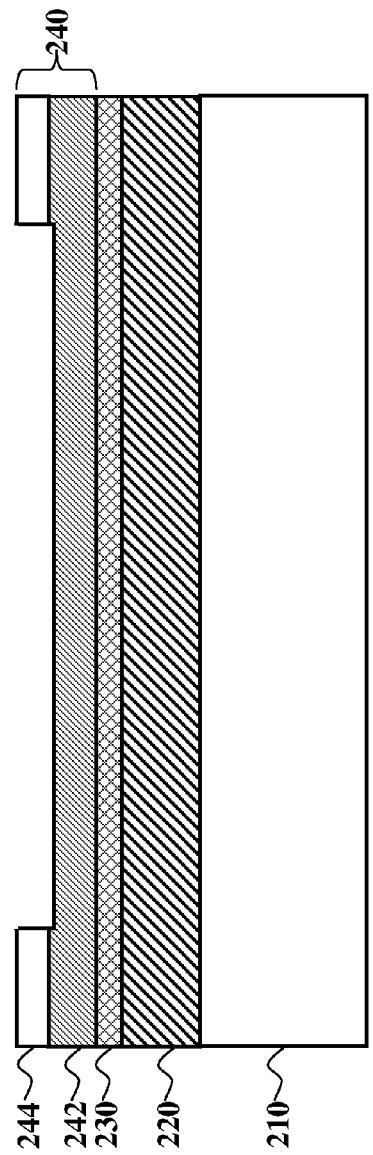

Referring to FIGS. 4A-4B and 5A-5B, portions of the hard mask layer 240 are removed to expose a portion of the resistive layer 230. In FIGS. 4A and 4B, a portion of the dielectric layer 244 of the hard mask layer 240 is removed. In the depicted embodiment, a lithography and etching process removes the portion of the dielectric layer 244. For example, a resist layer (not shown) is formed over the hard mask layer 240 and patterned by a lithography process to have one or more openings that define a pattern that exposes portions of the dielectric layer 244. An exemplary lithography process may include processing steps of resist coating, soft baking, mask aligning, exposing, post-exposure baking, developing the resist, and/or hard baking. The lithography process may be implemented or replaced by other proper techniques, such as maskless lithography, electron-beam writing, ion-beam writing, and/or molecular imprint. The lithography process may implement nanoimprint lithography techniques. An etching process, using the patterned resist layer as a mask, removes the exposed portions of the dielectric layer 244, thereby exposing portions of the barrier layer 242 of the hard mask layer 240. In the depicted embodiment, the etching process is a dry etching process. The dry etching process is a selective etching process, selected such that the barrier layer 242 acts as an etch stop layer. Alternatively, a wet etching process or combination dry and wet etching process could be utilized to remove the exposed portions of the dielectric layer 244. Thereafter, the patterned resist layer is removed, for example, by a resist stripping process, such as an $O_2$ plasma ashing process. A cleaning process may subsequently be performed. A residue layer, such as a TiO layer, may form over the exposed barrier layer 242. The residue layer may be removed by a suitable cleaning process, such as a $SF_6$ treatment.

Figure 5A:
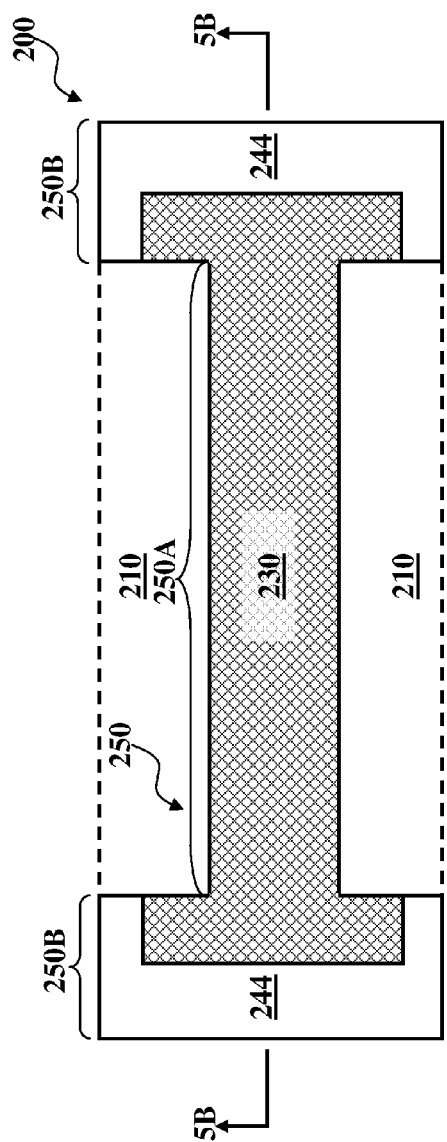
Figure 5B:
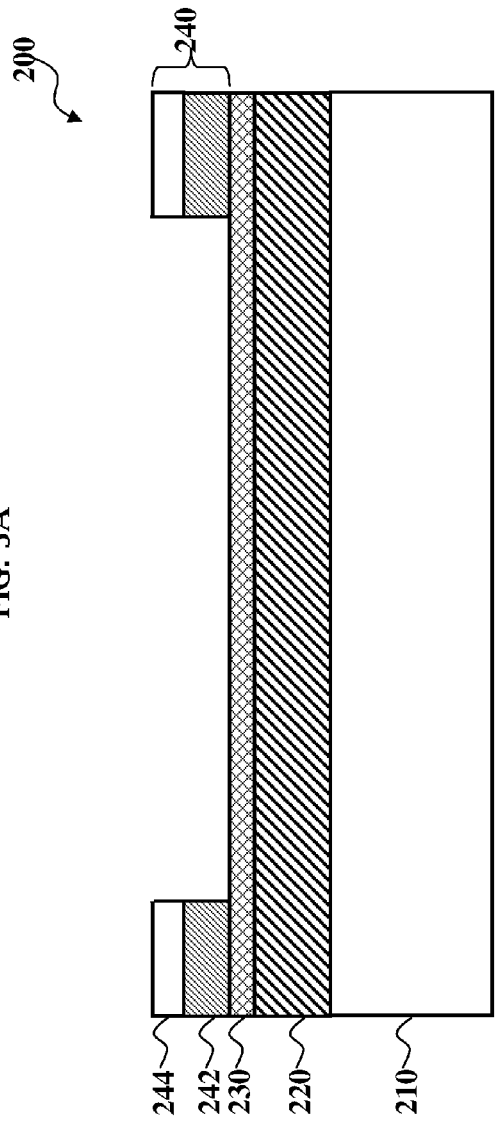

In FIGS. 5A and 5B, the exposed portion of the barrier layer 242 of the hard mask layer 240 is removed to expose the resistive layer 230. In the depicted embodiment, an etching process, using the patterned dielectric layer 244 as a mask, removes the exposed portions of the barrier layer 242, thereby exposing portions of the resistive layer 230. In the depicted embodiment, the etching process is a wet etching process. For example, the integrated circuit device 200 is subjected to a hydrogen peroxide ($H_2O_2$) wet dip to remove the exposed barrier layer 242. Alternatively, a dry etching process or combination dry and wet etching process could be utilized to remove the exposed portions of the barrier layer 242. A cleaning process may subsequently be performed. Subsequent processing may be performed to complete fabrication of the integrated circuit device 200. For example, a contact layer, such as an Al or AlCu layer, may be formed over the remaining hard mask layer 240 (including barrier layer 242 and dielectric layer 244) to form end contacts on the resistive layer 230. The end contacts may then be connected to other components of the integrated circuit device 200. The integrated circuit device 200 exhibits high precision and stability, including low thermal coefficient of resistance (TCR) and low voltage coefficient of resistance (VCR).

The present disclosure provides for many different embodiments. Different embodiments may have different advantages, and no particular advantage is necessarily required of any embodiment. For example, a method for fabricating an integrated circuit device includes providing a semiconductor substrate; forming a resistive layer over the semiconductor substrate; forming a hard mask layer over the resistive layer, wherein the hard mask layer includes a barrier layer over the resistive layer and a dielectric layer over the barrier layer; and forming an opening in the hard mask layer that exposes a portion of the resistive layer. The resistive layer includes SiCr, NiCr, or TaN. The barrier layer includes TiN, TiW, or Mo. The dielectric layer includes SiON, $SiO_2$, amorphous carbon layer, or combinations.

The opening in the hard mask layer may be formed by patterning the barrier layer by a first etching process, and patterning the dielectric layer by a second etching process. The opening in the hard mask layer may be formed by forming a resist layer over the dielectric layer; patterning the resist layer to expose a portion of the dielectric layer; etching the exposed portion of the dielectric layer, thereby exposing a portion of the barrier layer; thereafter, removing the resist layer; and etching the exposed portion of the barrier layer, thereby exposing the portion of the resistive layer.

In another example, a method for fabricating a thin film resistor includes providing a semiconductor substrate; forming an insulating layer over the substrate; forming a thin film resistor layer over the insulating layer; and forming a hard mask layer over the thin film resistor layer. The hard mask layer includes a barrier layer over the thin film resistor layer, and a dielectric layer over the barrier layer. The method also includes removing a portion of the dielectric layer to expose a portion of the barrier layer and removing the exposed portion of the barrier layer to expose a portion of the thin film resistor layer. In some embodiments, the thin film resistor layer is a SiCr layer, the barrier layer is a TiN layer, and the dielectric layer is a SiON layer.

Removing the portion of the dielectric layer may include forming a resist layer over the dielectric layer; patterning the resist layer to form an opening that exposes the portion of the dielectric layer; performing a dry etching process to remove the exposed portion of the dielectric layer, thereby exposing the portion of the barrier layer; and thereafter, removing the resist layer. Removing the exposed portion of the barrier layer may include performing a wet etching process. In some embodiments, before exposing the portion of the thin film resistor layer, the dielectric layer, barrier layer, and thin film resistive layer are patterned to define a shape of a thin film resistor structure. The patterning the dielectric, barrier, and thin film resistor layers may includes using a first mask, and the exposing the portion of the thin film resistor layer may include using a second mask;

In another example, a method includes providing a semiconductor substrate; forming a thin film resistor layer over the semiconductor substrate; forming a barrier layer over the thin film resistor layer; forming a dielectric layer over the barrier layer; using a first mask to pattern the dielectric layer, barrier layer, and thin film resistor layer, wherein the patterned dielectric, barrier, and thin film resistor layer define a shape of a thin film resistor structure; and using a second mask to remove portions of the patterned dielectric and barrier layers, to expose a portion of the patterned thin film resistor layer. The first mask may be used to define a thin film resistor portion and a landing pad area portion.

Using the first mask to pattern the dielectric, barrier, and thin film resistor layers may include forming a first photoresist layer over the dielectric layer; patterning the first photoresist layer using the first mask, thereby exposing a portion of the dielectric layer; etching the exposed portion of the dielectric layer and portions of the barrier and thin film resistor layers that underlie the exposed portion of the dielectric layer, thereby forming the patterned dielectric, barrier, and thin film resistor layers; and thereafter, removing the first photoresist layer. Using the second mask to remove portions of the patterned dielectric and barrier layers may include forming a second photoresist layer over the patterned dielectric layer; patterning the second photoresist layer using the second mask, thereby exposing a portion of the patterned dielectric layer; etching the exposed portion of the patterned dielectric layer, thereby exposing a portion of the patterned barrier layer; thereafter, removing the second photoresist layer; and etching the exposed portion of the patterned barrier layer, thereby exposing the portion of the patterned thin film resistor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a semiconductor substrate;
   forming a resistive layer over the semiconductor substrate;
   forming a hard mask layer over the resistive layer, wherein the hard mask layer includes a barrier layer over the resistive layer and a dielectric layer over the barrier layer;
   after forming the hard mask layer, patterning the resistive layer; and
   forming an opening in the hard mask layer that exposes a portion of the patterned resistive layer.

2. The method of claim 1 wherein the forming the resistive layer includes forming a SiCr, NiCr, or TaN layer.

3. The method of claim 1 wherein the forming the hard mask layer includes forming a TiN, TiW, or Mo layer as the barrier layer.

4. The method of claim 1 wherein the forming the hard mask layer includes forming a SiON layer, at least one other suitable dielectric material layer, or a combination thereof as the dielectric layer.

5. The method of claim 1 wherein the forming the opening in the hard mask layer that exposes the portion of the resistive layer includes:
patterning the barrier layer by a first etching process; and
patterning the dielectric layer by a second etching process.

6. The method of claim 1 wherein the forming the opening in the hard mask layer that exposes the portion of the resistive layer includes:
forming a resist layer over the dielectric layer;
patterning the resist layer to expose a portion of the dielectric layer;
etching the exposed portion of the dielectric layer, thereby exposing a portion of the barrier layer;
thereafter, removing the resist layer; and
etching the exposed portion of the barrier layer, thereby exposing the portion of the resistive layer.

7. The method of claim 6 wherein the etching the exposed portion of the dielectric layer includes performing a dry etching process.

8. The method of claim 7 wherein the performing the dry etching process includes performing a selective dry etching process, such that the barrier layer acts as an etch stop layer.

9. The method of claim 6 wherein the etching the exposed portion of the barrier layer includes performing a wet etching process.

10. The method of claim 9 wherein the performing the wet etching process includes performing a hydrogen peroxide ($H_2O_2$) wet dip process.

11. A method comprising:
providing a semiconductor substrate;
forming an insulating layer over the substrate;
forming a thin film resistor layer over the insulating layer;
forming a hard mask layer over the thin film resistor layer, the thin film resistor layer not being in the shape of a thin film resistor, and wherein the hard mask layer includes a barrier layer over the thin film resistor layer and a dielectric layer over the barrier layer;
after forming the hard mask layer, patterning the thin film resistor layer;
removing a portion of the dielectric layer to expose a portion of the barrier layer; and
removing the exposed portion of the barrier layer to expose a portion of the patterned thin film resistor layer.

12. The method of claim 11 wherein:
the forming the thin film resistor layer includes forming a SiCr layer;
the forming the barrier layer includes forming a TiN layer; and
the forming the dielectric layer includes forming a SiON layer.

13. The method of claim 11 wherein the removing the portion of the dielectric layer to expose the portion of the barrier layer includes:
forming a resist layer over the dielectric layer;
patterning the resist layer to form an opening that exposes the portion of the dielectric layer;
performing a dry etching process to remove the exposed portion of the dielectric layer, thereby exposing the portion of the barrier layer; and
thereafter, removing the resist layer.

14. The method of claim 13 wherein the removing the exposed portion of the barrier layer includes performing a wet etching process.

15. The method of claim 11 including:
before exposing the portion of the thin film resistor layer, patterning the dielectric layer, barrier layer, and thin film resistor layer to define a shape of a thin film resistor structure.

16. The method of claim 15 wherein:
the patterning the dielectric, barrier, and thin film resistor layers to define the thin film resistor structure includes utilizing a first mask; and
the exposing the portion of the thin film resistor layer includes utilizing a second mask.

17. A method comprising:
providing a semiconductor substrate;
forming a thin film resistor layer over the semiconductor substrate;
forming a barrier layer over the thin film resistor layer;
forming a dielectric layer over the barrier layer;
using a first mask to pattern the dielectric layer, barrier layer, and thin film resistor layer, wherein the patterned dielectric, barrier, and thin film resistor layers define a shape of a thin film resistor structure; and
using a second mask to remove portions of the patterned dielectric and barrier layers, to expose a continuous portion of the patterned thin film resistor layer, the continuous portion defining a resistive area.

18. The method of claim 17 wherein the using the first mask to form the patterned dielectric, barrier, and thin film resistor layers to define the shape of the thin film resistor structure includes:
defining a thin film resistor portion; and
defining a landing pad area portion.

19. The method of claim 17 wherein the using the first mask to pattern the dielectric layer, barrier layer, and thin film resistor layer includes:
forming a first photoresist layer over the dielectric layer;
patterning the first photoresist layer using the first mask, thereby exposing a portion of the dielectric layer;
etching the exposed portion of the dielectric layer and portions of the barrier and thin film resistor layers that underlie the exposed portion of the dielectric layer, thereby forming the patterned dielectric, barrier, and thin film resistor layers; and
thereafter, removing the first photoresist layer.

20. The method of claim 19 wherein the using the second mask to remove portions of the patterned dielectric and barrier layers to expose the portion of the patterned thin film resistor layer includes:
forming a second photoresist layer over the patterned dielectric layer;
patterning the second photoresist layer using the second mask, thereby exposing a portion of the patterned dielectric layer;
etching the exposed portion of the patterned dielectric layer, thereby exposing a portion of the patterned barrier layer;
thereafter, removing the second photoresist layer; and
etching the exposed portion of the patterned barrier layer, thereby exposing the portion of the patterned thin film resistor layer.

* * * * *